United States Patent
Thean et al.

(10) Patent No.: US 7,067,868 B2
(45) Date of Patent: Jun. 27, 2006

(54) DOUBLE GATE DEVICE HAVING A HETEROJUNCTION SOURCE/DRAIN AND STRAINED CHANNEL

(75) Inventors: Voon-Yew Thean, Austin, TX (US); Mariam G. Sadaka, Austin, TX (US); Ted R. White, Austin, TX (US); Alexander L. Barr, Crolles (FR); Venkat R. Kolagunta, Austin, TX (US); Bich-Yen Nguyen, Austin, TX (US); Victor H. Vartanian, Dripping Springs, TX (US); Da Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 43 days.

(21) Appl. No.: 10/952,676

(22) Filed: Sep. 29, 2004

(65) Prior Publication Data

US 2006/0065927 A1    Mar. 30, 2006

(51) Int. Cl.
*H01L 27/108* (2006.01)

(52) U.S. Cl. ........................... 257/296; 257/327
(58) Field of Classification Search ............ 257/296, 257/327, 347, 368
See application file for complete search history.

(56) References Cited

U.S. PATENT DOCUMENTS 6,124,627 A    9/2000 Rodder et al.
6,638,802 B1   10/2003 Hwang et al.
6,838,322 B1    1/2005 Pham et al.
2005/0205934 A1 9/2005 Lochtefeld et al.

FOREIGN PATENT DOCUMENTS

WO    WO 02/45156 A2    6/2002

OTHER PUBLICATIONS

Jung, Jongwan et al.; "Implementation of Both High-Hole and Electron Mobility in Strained Si/Strained $Si_{1-y}Ge_y$ on Relaxed $Si_{1-x}Ge_x$ (x<y) Virtual Substrate"; IEEE Electron Device Letters; Jul. 2003; pp. 460-462; vol. 24, No. 7; IEEE.

(Continued)

Primary Examiner—Douglas W. Owens
(74) Attorney, Agent, or Firm—Robert L. King; Michael J. Balconi-Lamic (57) ABSTRACT

A semiconductor device (10) is formed by positioning a gate (22) overlying a semiconductor layer (16) of preferably silicon. A semiconductor material (26) of, for example only, SiGe or Ge, is formed adjacent the gate over the semiconductor layer and over source/drain regions. A thermal process diffuses the stressor material into the semiconductor layer. Lateral diffusion occurs to cause the formation of a strained channel (17) in which a stressor material layer (30) is immediately adjacent the strained channel. Extension implants create source and drain implants from a first portion of the stressor material layer. A second portion of the stressor material layer remains in the channel between the strained channel and the source and drain implants. A heterojunction is therefore formed in the strained channel. In another form, oxidation of the stressor material occurs rather than extension implants to form the strained channel.

17 Claims, 10 Drawing Sheets

OTHER PUBLICATIONS

Shima, M. et al., "<100> Channel Strained-SiGe p-MOSFET with Enhanced Hole Mobility and Lower Parasitic Resistance"; 2002 Symposium on VLSI Technology Digest of Technical Papers; 2002; pp. 94-95; IEEE.

Yen; Yee Chia et al.; "Nanoscale Ultra-Thin-Body Silicon-on-Insulator P-MOSFET with a SiGe/Si Heterostructure Channel"; Apr., 2000; pp. 161-163; vol. 21, No. 4; IEEE.

Kim, Sung Min et al.; "Fully Working High Performance Multi-channel Field Effect Transistor (McFET) SRAM Cell on Bulk Si substrate Using TiN Single Metal Gate"; 2005 Symposium of VLSI Technology Digest of Technical Papers; 2005; pp. 196-197.

Verheyen P., "25% Drive Current Improvement for p-type Multiple Gate FET (MuGFET) Devices by the Introduction of Recessed $Si_{0.8}Ge_{0.2}$ in the Source and Drain Regions"; 2005 Symposium on VLSI Technology Digest of Technical Papers; 2005; pp. 194-195.

Kedzierski, Jakub et al.; "Extension and Source/Drain Design for High-Performance FinFET Devices"; IEEE Transactions on Electron Devices; Apr., 2003; pp. 952-958; vol. 50, No. 4; IEEE.

Choi, Yang-Kyu et al.; "Sub 20nm CMOS FinFET Technologies"; 2001 ; 4 pgs ; IEEE.

DOUBLE GATE DEVICE HAVING A HETEROJUNCTION SOURCE/DRAIN AND STRAINED CHANNEL

CROSS REFERENCE TO RELATED APPLICATION

This application is related to our U.S. Patent Application, U.S. Ser. No. 10/954,121, now U.S. Pat. No. 7,018,901, entitled "Method For Forming A Semiconductor Device Having A Strained Channel And A Heterojunction Source / Drain", filed simultaneously herewith and assigned to the assignee hereof.

FIELD OF THE INVENTION

This invention relates generally to semiconductor, and more specifically, to making semiconductor devices having very small dimensions.

BACKGROUND OF THE INVENTION

Semiconductor devices, such as transistor structures, continue to be scaled to smaller dimensions as process lithography improves. However, different challenges have been encountered in the scaling of transistor structures much below 100 nm. Additionally, when transistor dimensions on the order of 100 nm and smaller are used, implants cannot be adequately controlled with conventional semiconductor fabrication equipment. Channel dopant fluctuations adversely affect device uniformity within circuits. To control a conventional bulk transistor's threshold voltage which is the voltage at which the transistor becomes conductive, dopants in the channel are used. However, channel doping is not an efficient method for ultra-thin devices due to the large amount of channel impurities that are required. Therefore, highly doped ultra-thin devices are even more susceptible to threshold voltage fluctuations. Additionally, high channel doping concentrations degrade both electron and hole mobility and promote source/gate and drain/gate junction leakage.

A technique to improve bulk transistor performance is to provide a bulk transistor having a strained channel. Such devices are structured to place a strain on the transistor's channel. An appropriately strained channel results in electron and hole mobility enhancement that increases the conduction current which provides a higher device drive performance.

One method to form a transistor having a strained channel is to recess silicon material in those areas where the source and drain are to be formed and re-grow a stressor material in the recessed areas. However, when thin-body devices are being implemented, the depth available for the stressor material is insufficient to adequately strain the channel. Another issue with this technique is that the silicon material is recessed with an etch process. Stopping the etch process at a desired depth is a challenge and subject to variation. Additionally, re-growth of the stressor material on the remaining ultra-thin silicon is problematic. Also, the ultra-thin silicon can agglomerate at temperatures required for growing the stressor material. Additionally, this method does not apply to the known FINFET structures or any thin-body transistor devices.

Another known method to induce stress into a channel is the use of a substrate as a stressor material. A shortcoming with this approach is that when the stressor material is SiGe, the SiGe causes degradation of the gate dielectric due to increased interface states when the Ge diffuses to the dielectric semiconductor interface. The material SiGe has a narrow bandgap. Therefore, another issue with this approach is that the presence of SiGe in the transistor's channel increases the transistor's off-state current leakage. Additionally, this method does not apply to the known FINFET structures or any vertical thin body double gate transistor.

Yet another known method of stressing a transistor channel is the use of overlying stress inducing layers over the active regions of the transistor. However, the stressor material is located far enough from the channel so that the influence of the stressor material on the channel is diminished.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
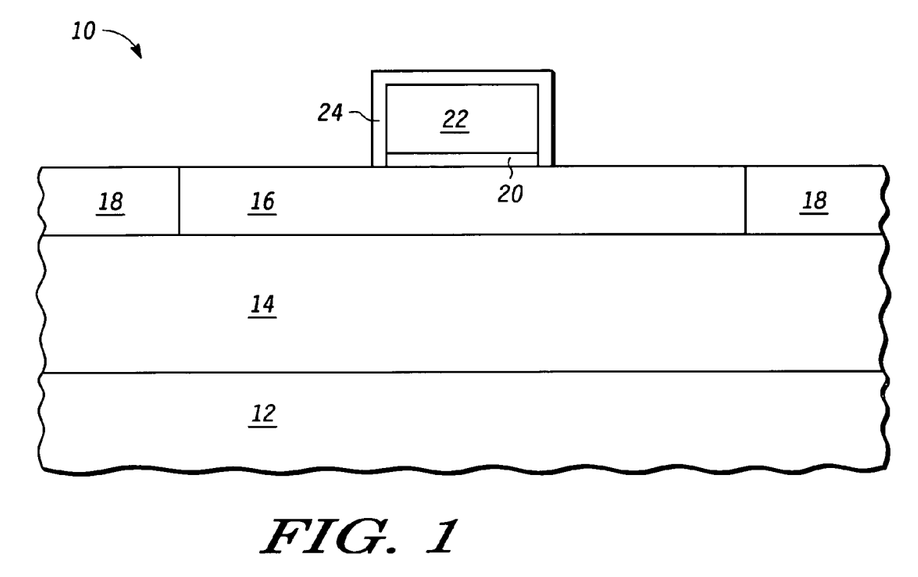
FIGS. 1–5 illustrate in cross-sectional form a method of forming an ultra-thin body transistor in accordance with one form of the present invention.

Illustrated in FIG. 1 is a semiconductor device 10 in accordance with the present invention. A substrate 12 is provided. In one form substrate 12 is silicon. However, any semiconductor material may be used. An overlying dielectric layer 14 is formed. Wafer bonding or implantation of an oxygen species material may be used to form the dielectric layer 14. In one form, the dielectric layer 14 is an oxide. A semiconductor layer 16 is formed and patterned overlying a portion of the dielectric layer 14. In one form the semiconductor layer 16 is silicon and has a thickness such that an aspect ratio that is equal to the gate length divided by the thickness of semiconductor layer 16 is at least three. Therefore, semiconductor layer 16 is relatively thin. Adjacent the semiconductor layer 16 is isolation region 18. It should be understood that isolation region 18 may either be a void of material or any dielectric material. Therefore, in one form the isolation region 18 is a void. A gate dielectric 20 is formed overlying the semiconductor layer 16. A gate 22 is formed overlying the gate dielectric 20. A dielectric layer 24, such as a nitride, is formed around the gate 22 and the gate dielectric 20. The composition of dielectric layer 24 is a material that minimizes oxygen diffusion into gate dielectric 20 and is also thermally stable. Other materials in addition to nitride may therefore be used.

Figure 2:
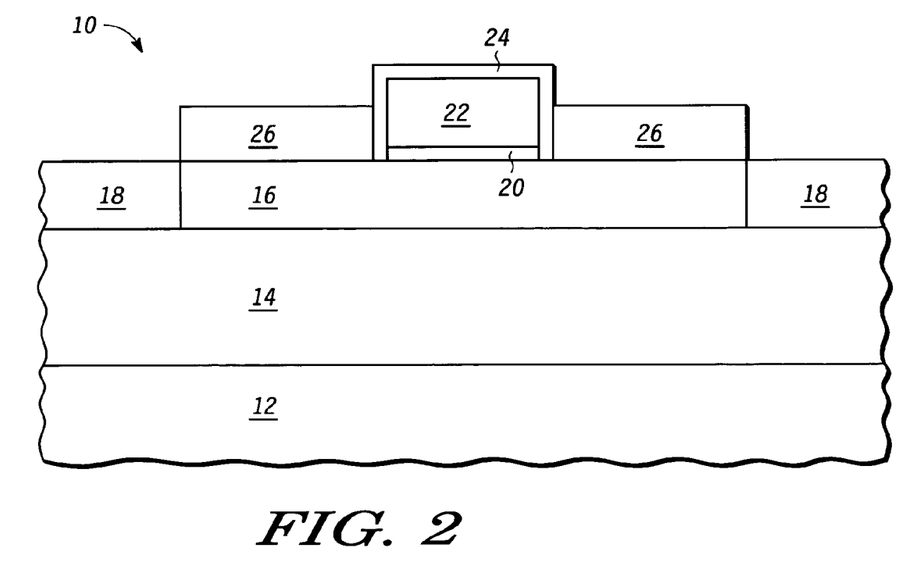

Illustrated in FIG. 2 is further processing of semiconductor device 10. In FIG. 2 a semiconductor material 26 is selectively deposited or epitaxially grown in the source/drain regions of semiconductor device 10. In one form, the semiconductor material 26 is SiGe or even pure Ge and can be used as a material to induce stress in a transistor channel. In yet other forms semiconductor material 26 may be implemented as carbon doped silicon. If carbon doped silicon is implemented, the resulting strain as described below is tensile instead of compressive. Other semiconductor materials may also be used for semiconductor material 26. Selection of which semiconductor material will also directly affect the semiconductor device 10 threshold voltage, Vt. It should be well understood that other stressor materials may be used. In the illustrated form, the semiconductor material 26 is selectively grown. Various thicknesses may be used for semiconductor material 26.

Figure 3:
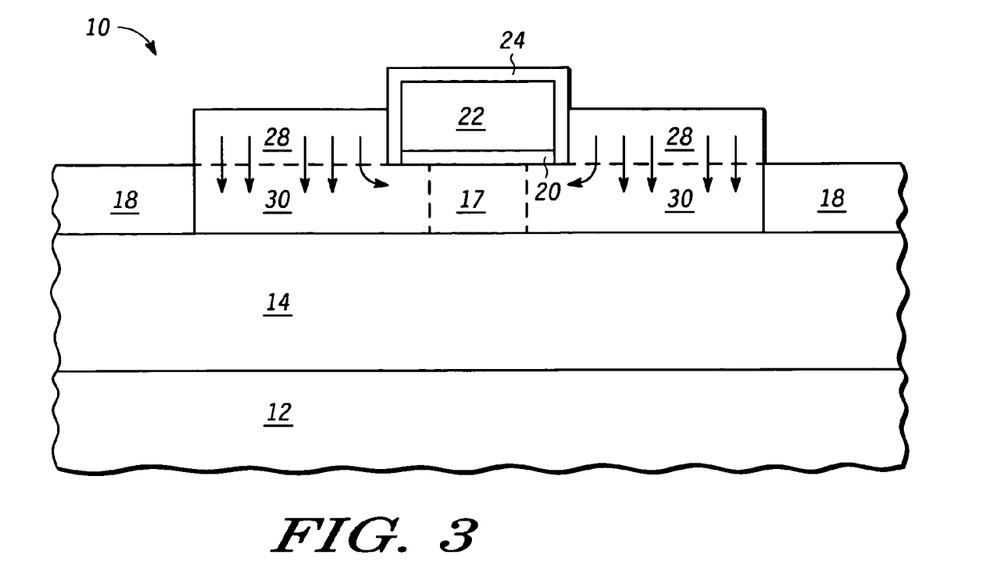

Illustrated in FIG. 3 is further processing of semiconductor device 10. In particular, a thermal process like RTA or a furnace anneal, is used to cause the semiconductor material 26 to diffuse into the underlying semiconductor layer 16. Semiconductor material 26 laterally diffuses to the source-to-channel interface and the drain-to-channel interface. The thermal processing changes the semiconductor material 26 into a diffusion source 28 of SiGe. The diffusion source 28 has a reduced concentration of Ge as a result of the diffusing from an original concentration of Ge in the as-deposited or grown layer. The SiGe diffusion source 28 has a lower Ge concentration. It should be noted that the diffusion from the diffusion source 28 is into semiconductor layer 16 and spreads toward and under the gate 22 as indicated by the arrows of FIG. 3. As a result of the Ge diffusion, the semiconductor layer 16 becomes a stressor material layer 30. A channel region underlies gate 22. The diffusion of Ge into stressor material layer 30 causes the formation of a strained channel 17. The vertical dashed line boundary of the strained channel denotes the stressor material layer 30-to-strained channel 17 boundary formed by the lateral diffusion of Ge. It should be noted that the stressor material layer 30 is immediately adjacent to the strained channel 17 and therefore can exert significant influence on the channel.

In an alternative form, the diffusion of Ge into stressor material layer 30 is continued with additional thermal processing or oxidation according to the requirements of a particular semiconductor device. In one embodiment the additional processing is continued until a uniform material exists in both the stressor material layer 30 and the strained channel 17. In this form, a compressive material exists uniformly laterally in the source, the channel and the drain. The substantially uniform compressive layer that extends through the channel from the source and the drain is desirable for P-channel conductivity transistors. The remaining drawings will however illustrate a structure wherein such additional processing is not implemented and will illustrate different channel and source/drain materials.

Figure 4:
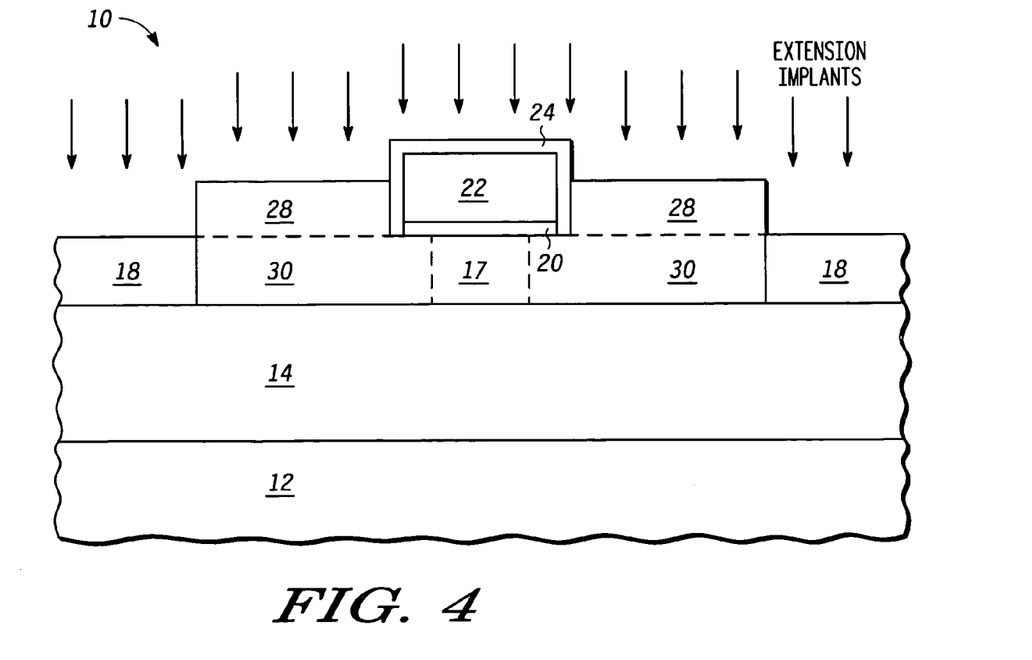

Illustrated in FIG. 4 is further processing of semiconductor device 10. In particular, extension implants are performed to create source and drain implants. The extension implants result in formation of dopants in the stressor material layer 30 and diffusion source 28. The implanted dopants into diffusion source 28 and stressor material layer 30 are annealed to form source and drain extensions in both of these layers.

Figure 5:
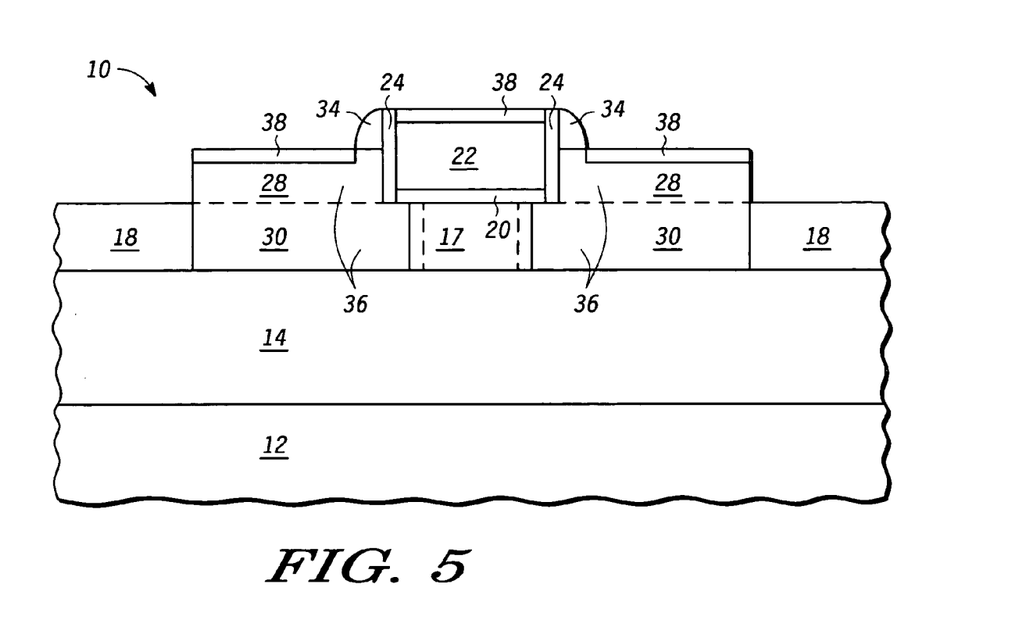

Illustrated in FIG. 5 is further processing of semiconductor device 10. In particular, a completed functional transistor is formed. Sidewall spacers 34 are formed adjacent to dielectric layer 24 in a conventional manner. A thermal anneal process step is performed to cause diffusion of the implanted dopants to form the doped source/drain regions 36. A first portion of stressor material layer 30 becomes doped forming the source/drain regions 36. A second portion of stressor material layer 30 remains in the channel between the vertical dashed lines defining the strained channel 17 and the edge of the doped source/drain regions 36. Two heterojunctions as indicated by each of the two vertical dashed lines in FIG. 5 are therefore formed between the strained channel 17 and each of a respective one of the doped source/drain regions 36. Silicided regions 38 are formed in a conventional manner overlying the diffusion source 28 and the gate 22. At this point there has been provided a transistor having a strained channel and heterojunctions in the channel. Also, semiconductor device 10 has a raised source/drain with respective elevated extensions that are the portion of diffusion source 28 underlying the sidewall spacer 34. Because the stressor material layer 30 is in very close proximity to the strained channel 17, improved electron and hole mobility and transistor conduction current.

Figure 6:
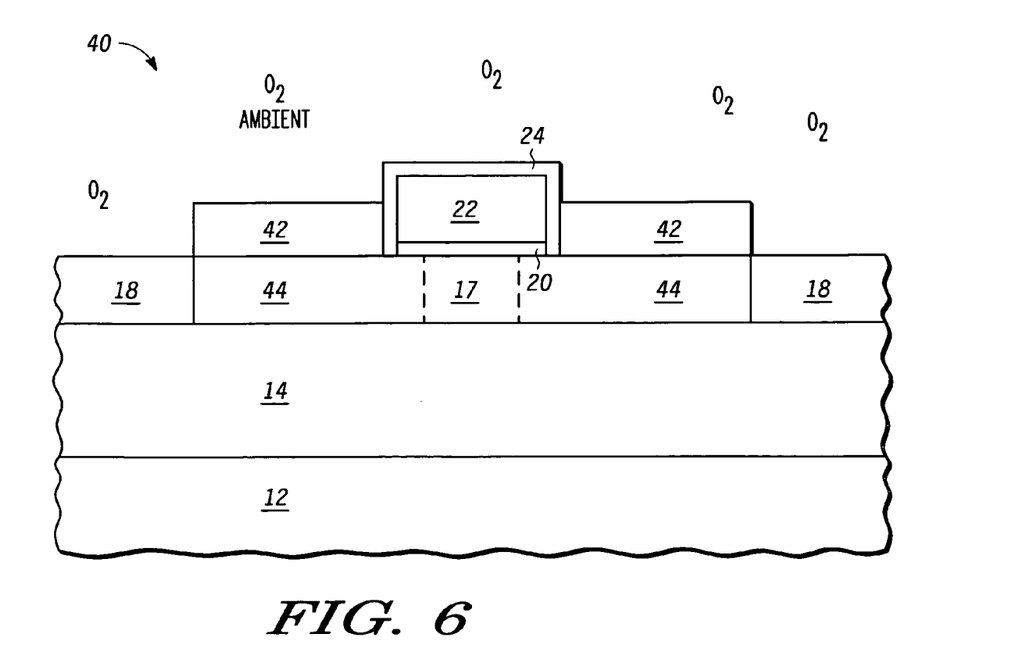
FIGS. 6–9 illustrate in cross-sectional form a method of forming an ultra-thin body transistor in accordance with another form of the present invention.

Another form of the present invention begins with processing of the structure illustrated in FIG. 2. Illustrated in FIG. 6 is a semiconductor device 40 resulting after oxidation of semiconductor material 26 of the semiconductor device 10 of FIG. 2 in an oxygen ambient. For ease of explanation, elements that are common between FIGS. 1 and 2 and FIG. 6 are similarly numbered and the formation of common structural elements will not be repeated. The oxidizing ambient may contain $H_2O$ and/or HCl. As a result of the oxidation processing, a portion of the semiconductor layer 16 becomes a silicon germanium (SiGe) stressor material layer 44. A portion of the semiconductor layer 16 that does not comprise SiGe remains as the strained channel 17. The semiconductor material 26 becomes an overlying $SiO_2$ insulating layer 42. Both the insulating layer 42 and the silicon germanium stressor material layer 44 overlie dielectric layer 14. Again, the silicon germanium stressor material layer 44 should have a thickness such that an aspect ratio of the gate length ratioed to the thickness of silicon germanium stressor material layer 44 is at least three. Therefore, silicon germanium stressor material layer 44 is relatively thin. Therefore, in this form the silicon germanium is formed in stressor material layer 44 by an oxidizing ambient rather than by diffusion alone. An advantage of this form is that the germanium content of silicon germanium stressor material layer 44 can be higher than when germanium is used in the stressor material layer 30 of FIG. 3. It should be noted that other stressor materials besides SiGe may be used.

Figure 7:
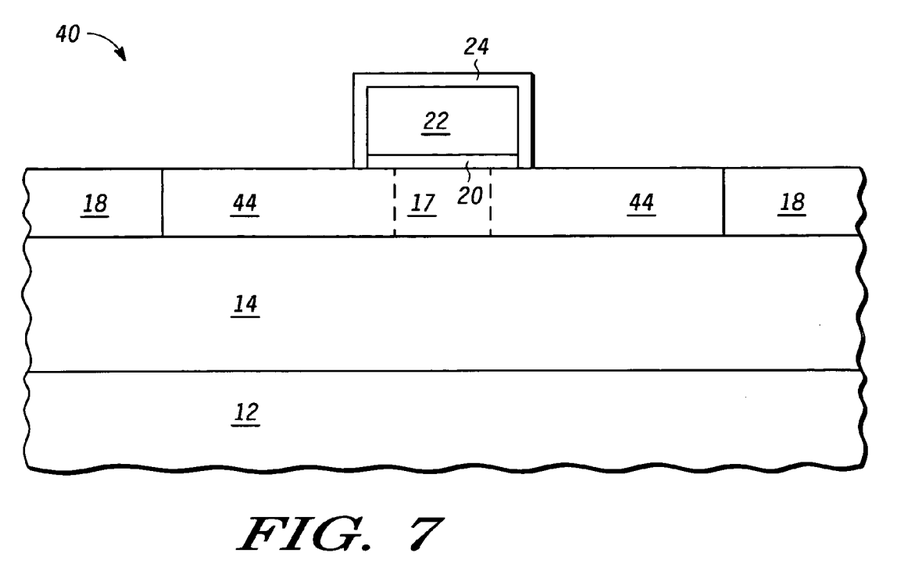

Illustrated in FIG. 7 is further processing of semiconductor device 40. In FIG. 7, the insulating layer 42 is removed from semiconductor device 40. In one form, insulating layer 42 is removed by an etch, either wet or dry. A strained channel 17 is indicated by vertical dashed lines. It should be noted that the stressor material layer 44 is immediately adjacent to the strained channel 17 and therefore can exert significant influence on the strained channel 17.

Figure 8:
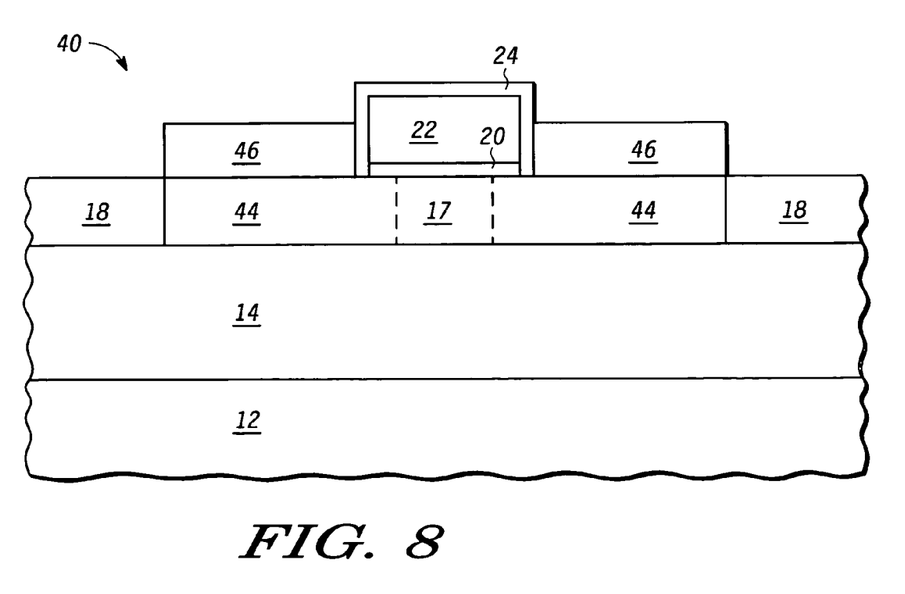

Illustrated in FIG. 8 is further processing of semiconductor device 40. A raised source/drain extension is formed adjacent the dielectric layer 24 by selective growth or deposition of a semiconductor layer 46. Semiconductor layer 46 in one form is made of silicon, but may be any semiconductor material such as silicon germanium, etc. Extension implants are performed to create source and drain implants. The extension implants result in formation of dopants at an interface between stressor material layer 44 and semiconductor layer 46. The implanted dopants into semiconductor layer 46 and stressor material layer 44 are annealed to form source and drain extensions in both of these layers. It should be noted that the presence of semiconductor layer 46 functions to decrease the sheet resistivity of the material to be used as the source and drain of semiconductor device 40 since semiconductor device 40 is a thin body device. A reason for the decreased resistivity is the increased amount of semiconductor material that is present for the source/drain elements.

Figure 9:
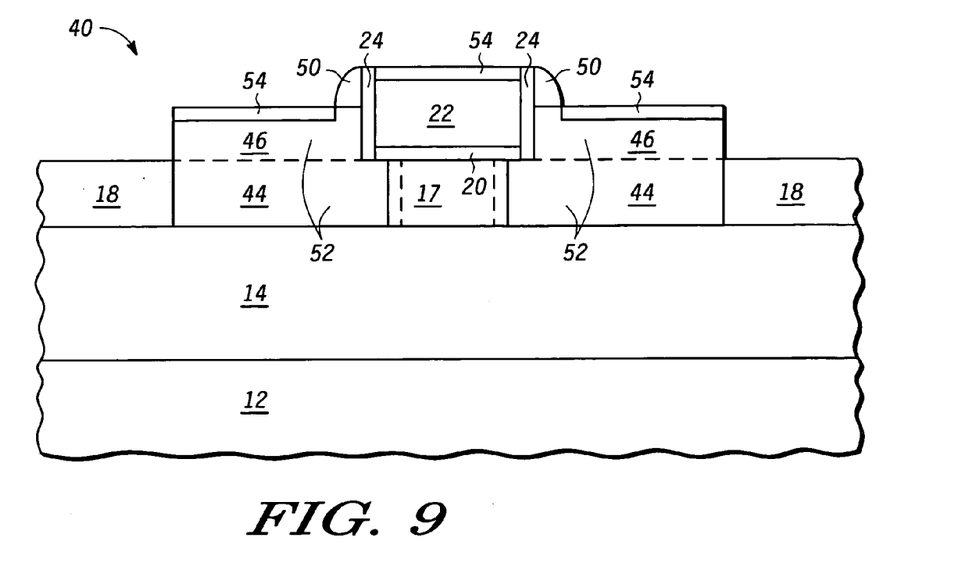

Illustrated in FIG. 9 is further processing of semiconductor device 40. In particular, a completed functional transistor is formed. Sidewall spacers 50 are formed adjacent to dielectric layer 24 in a conventional manner. A thermal anneal process step is performed to cause diffusion of the implanted dopants to form the doped source/drain regions 52. A first portion of stressor material layer 44 becomes doped forming the source/drain regions 52. A second portion of stressor material layer 44 remains in the channel between the vertical dashed lines defining the strained channel 17 and the edge of the doped source/drain regions. Two heterojunctions as indicated by each of the two vertical dashed lines in FIG. 9 are therefore formed between the strained channel 17 and each of a respective one of the doped source/drain regions 52. Silicided regions 54 are formed in a conventional manner overlying the semiconductor layer 46 and the gate 22. At this point there has been provided a transistor having a strained channel and heterojunctions in the channel. Also, semiconductor device 40 has a raised source/drain with respective elevated extensions that are the portion of semiconductor layer 46 underlying the sidewall spacer 50. Because the stressor material layer 44 is in very close proximity to the strained channel 17, improved electron and hole mobility and transistor conduction current.

Figure 10:
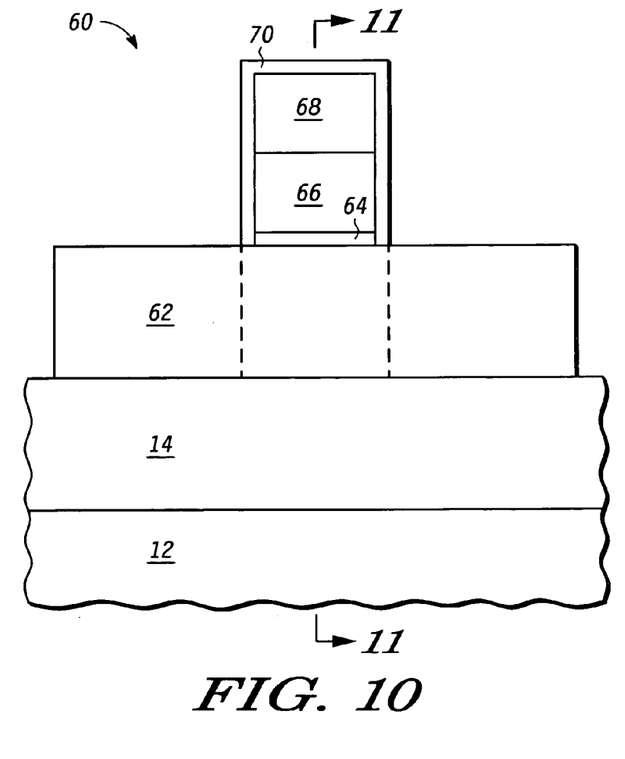
FIGS. 10–15 illustrate in cross-sectional form an ultra-thin double gate device in accordance with one form of the present invention.

Illustrated in FIG. 10 is a semiconductor device 60 that is the initial formation of a double gate transistor. For convenience of explanation, elements that are analogous in the initial formation with FIGS. 1–9 are similarly numbered. In one form, the double gate transistor described herein is implemented as a FINFET. Other double gate transistors may be formed. Substrate 12 is provided with overlying dielectric layer 14 as previously described. Overlying the dielectric layer 14 is a silicon layer 62 that will function as a fin structure for the double gate transistor. It should be understood that semiconductor materials other than silicon may be used to implement silicon layer 62. Portions of silicon layer 62 will subsequently function as the source and drain of the double gate transistor. Overlying silicon layer 62 is an oxide layer 64. The oxide layer 64 functions as: (1) an oxidation barrier; and (2) a stress buffer between silicon layer 62 and a thicker insulator 66 that overlies the oxide layer 64. Overlying the thicker insulator 66 is a gate 68. A surrounding dielectric layer 70 is formed around the periphery of gate 68 to function as a barrier.

Figure 11:
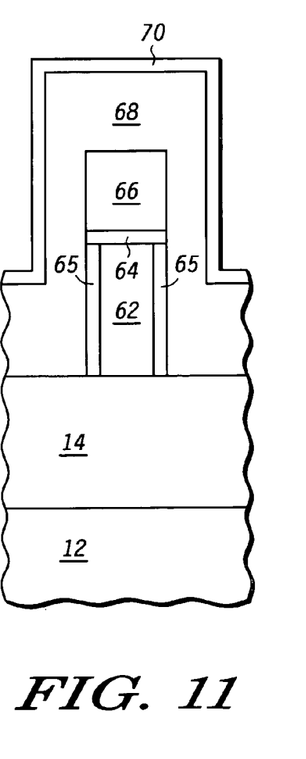

Illustrated in FIG. 11 is a cross-sectional view taken along line 11—11 of FIG. 10. In addition to the reference numbers described above in connection with FIG. 10, there is also disclosed a gate dielectric 65 that surrounds the vertical sidewalls of the silicon layer 62.

Figure 12:
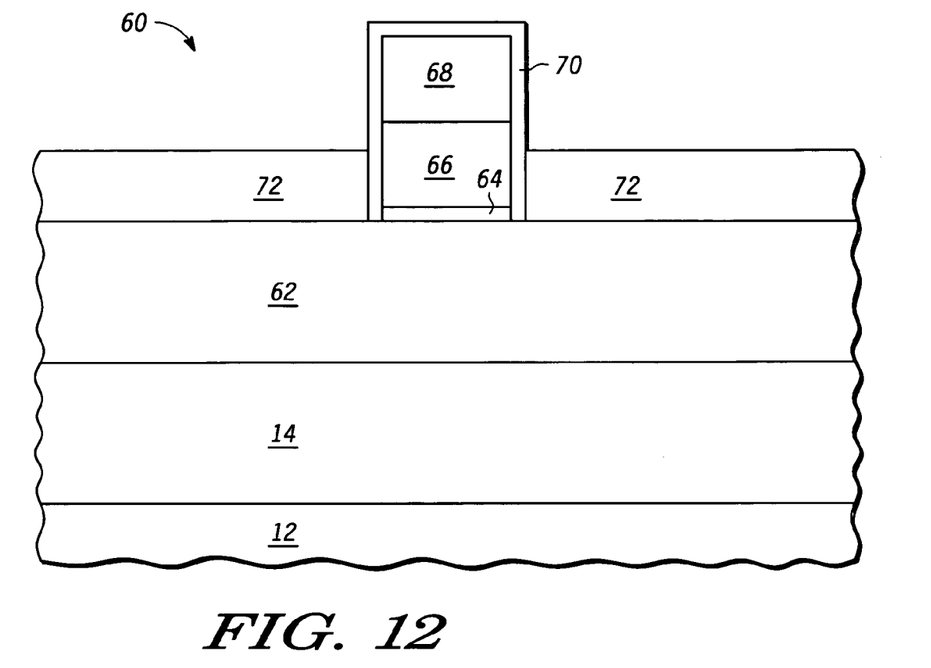

Illustrated in FIG. 12 is a cross-sectional view of semiconductor device 60 wherein a semiconductor material 72 is selectively grown or deposited by overlying and surrounding silicon layer 62. The semiconductor material 72 is silicon germanium (SiGe) and may be of other materials such as silicon carbon, carbon and other Group IV elements or alloys.

Figure 13:
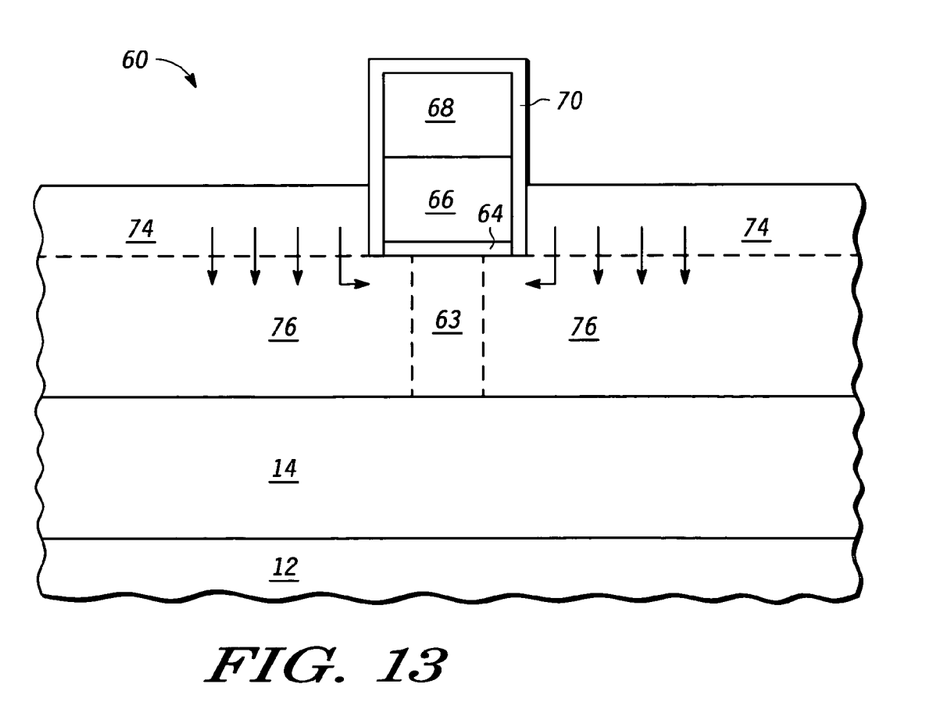

Illustrated in FIG. 13 is a cross-sectional view of semiconductor device 60 wherein the germanium of semiconductor material 72 is diffused by an anneal into silicon layer 62 forming a depleted SiGe region 74. The arrows in FIG. 13 indicated that the Ge is diffused both vertically and horizontally into a diffused SiGe stressor layer 76. The channel region is now illustrated below the gate electrode as indicated by vertical dashed lines. The diffusion of Ge into the SiGe stressor layer 76 forms a strained channel 63 in which Ge is located in close proximity to the strained channel 63. The vertical dashed lines of strained channel 63 represent a heterojunction within the semiconductor device 60.

In an alternative form, the diffusion of Ge into stressor layer 76 is continued with additional thermal processing or oxidation according to the requirements of a particular semiconductor device. In one embodiment the additional processing is continued until a uniform material exists in both the stressor layer 76 and the strained channel 63. In this form, a compressive material exists uniformly laterally in the source, the channel and the drain. The substantially uniform compressive layer that extends through the channel from the source and the drain is desirable for P-channel conductivity transistors. In such an embodiment, there are no heterojunctions in the channel.

Figure 14:
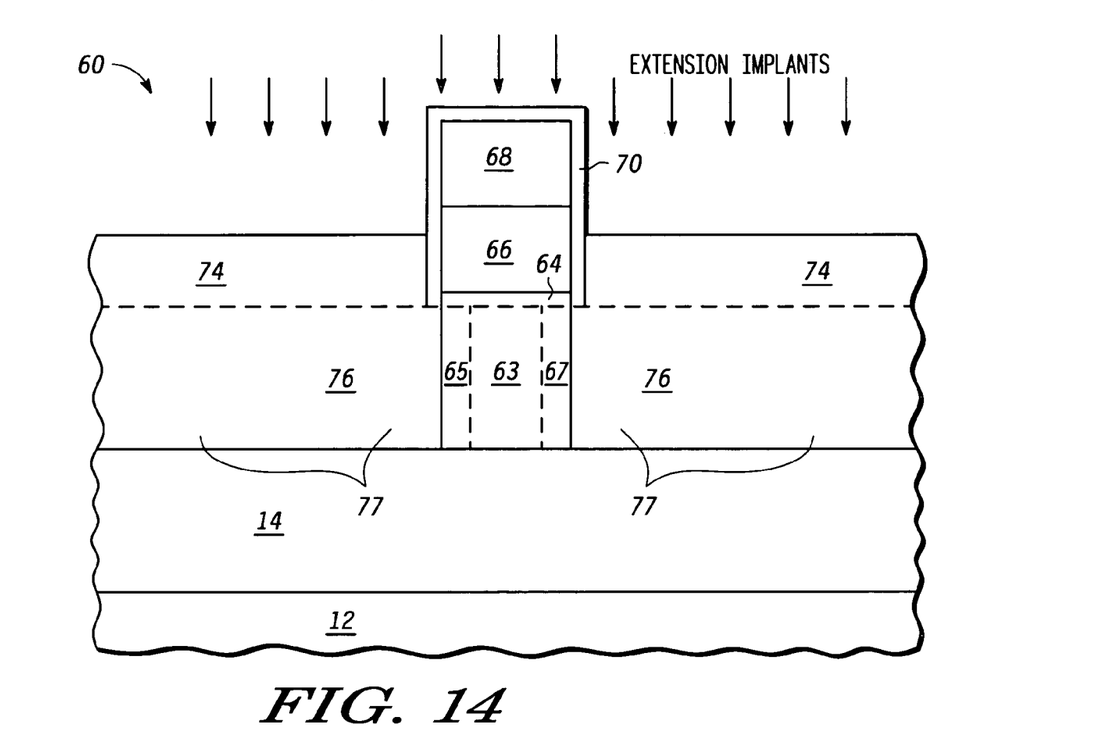
Figure 15:
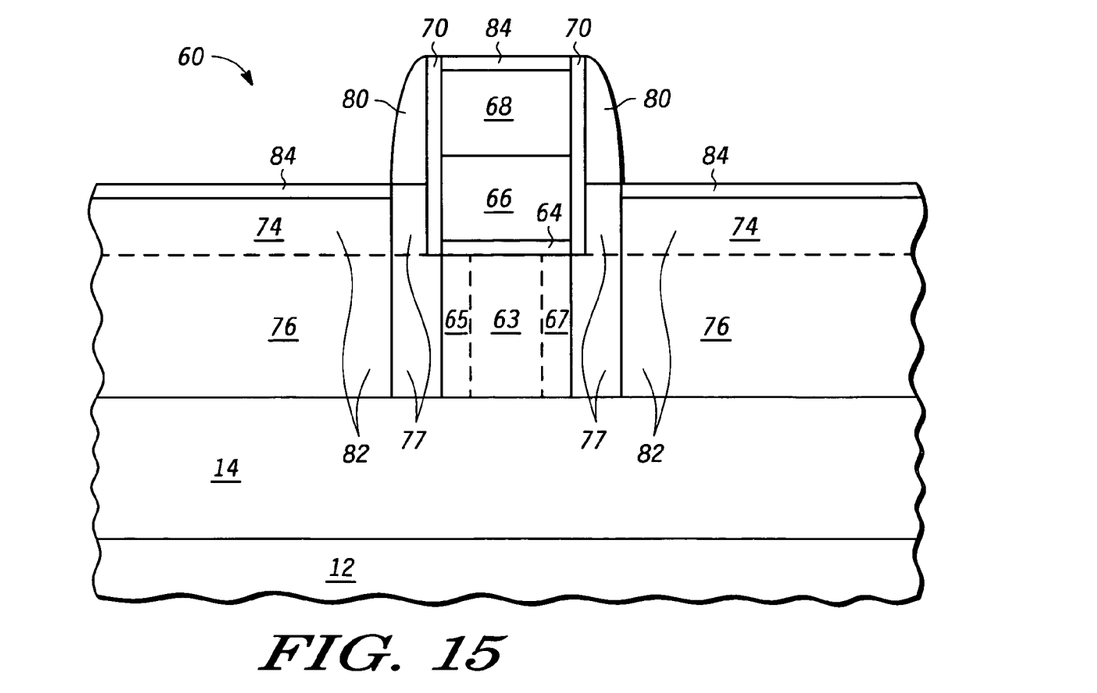

Illustrated in FIG. 14 is a cross-sectional view of semiconductor device 60 wherein source/drain extension implants are formed. The extension implants are performed to create source and drain implants. The extension implants result in formation of dopants at an interface between stressor layer 76 and SiGe region 74 as indicated by the dashed line separating stressor layer 76 and SiGe region 74. The implanted dopants into diffusion SiGe region 74 and stressor layer 76 are annealed to form source and drain extensions 77 in both of these layers. Two heterojunctions as indicated by each of the two vertical dashed lines in FIG. 15 are therefore formed between the strained channel 63 and each of a respective one of the source and drain extensions 77. In one form the strained channel is undoped silicon. A section 65 and a section 67 of the channel respectively exist between each heterojunction and a junction between the channel and the source and drain extensions 77, respectively. In one form, section 65 and section 67 are undoped silicon germanium and the source and drain extensions 77 are doped silicon germanium.

Illustrated in FIG. 15 is a cross-sectional view of semiconductor device 60 wherein a completed functional transistor is formed. Sidewall spacers 80 are formed adjacent to dielectric layer 70 in a conventional manner. A thermal anneal process step is performed to cause diffusion of the implanted dopants to form the doped source/drain regions 82. A first portion of stressor layer 76 becomes doped forming the source/drain regions 82. A second portion of stressor layer 76 remains adjacent the strained channel 63 between the vertical dashed lines defining the strained channel 63 and the edge of the doped source and drain extensions 77. Silicided regions 84 are formed in a conventional manner overlying the source/drain regions 82 and the gate 68. At this point there has been provided a transistor having a strained channel and heterojunctions in the channel. Also, semiconductor device 60 has a raised source/drain with respective elevated extensions that are the former portion of SiGe region 74 underlying the sidewall spacer 80. Because the stressor layer 76 is in very close proximity to the strained channel 63, improved electron and hole mobility and transistor conduction current. While a FINFET embodiment is herein disclosed, it should be well understood that a strained channel transistor may be implemented for any double gate structure using the teachings provided herein.

Figure 16:
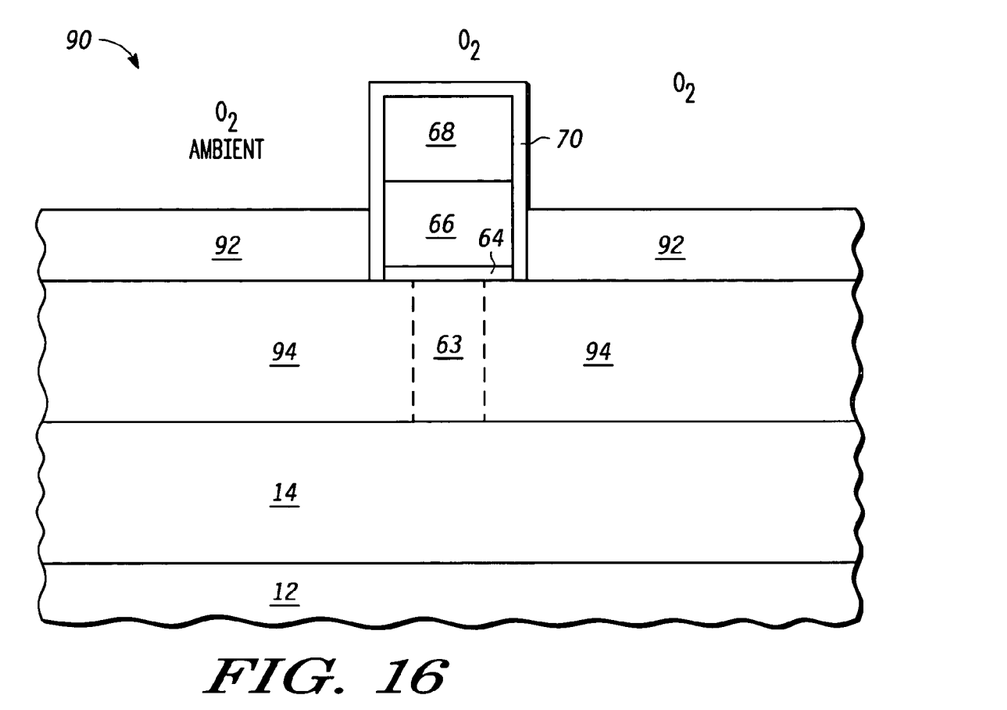
FIGS. 16–19 illustrate in cross-sectional form another ultra-thin double gate device in accordance with another form of the present invention.

Illustrated in FIG. 16 is a cross-sectional view of a semiconductor device 90 wherein the initial formation of a double gate transistor has been performed in accordance with the formation of semiconductor device 60 of FIGS. 10–12. For purposes of convenience, common element numbers between FIGS. 10–12 and FIG. 16 will be used and a repetition of the discussion of those common elements will not be repeated. Illustrated in FIG. 16 is semiconductor device 90 resulting after oxidation in an oxygen ambient of semiconductor material 72 of the semiconductor device 60 of FIG. 12. The oxidizing ambient may contain $H_2O$ and/or HCl. A silicon germanium (SiGe) stressor layer 94 and overlying $SiO_2$ insulating layer 92 both overlie dielectric layer 14. Again, the silicon germanium stressor layer 94 should have a thickness such that an aspect ratio of the gate length ratioed to the thickness of silicon germanium stressor layer 94 is at least three. Therefore, silicon germanium stressor layer 94 is relatively thin. Therefore, in this form the silicon germanium is formed in stressor layer 94 by an oxidizing ambient rather than by diffusion alone. An advantage of this form is that the germanium content of silicon germanium stressor layer 94 can be higher than when germanium is used in the stressor layer 76 of FIG. 13. It should be noted that other stressor materials besides SiGe may be used.

Figure 17:
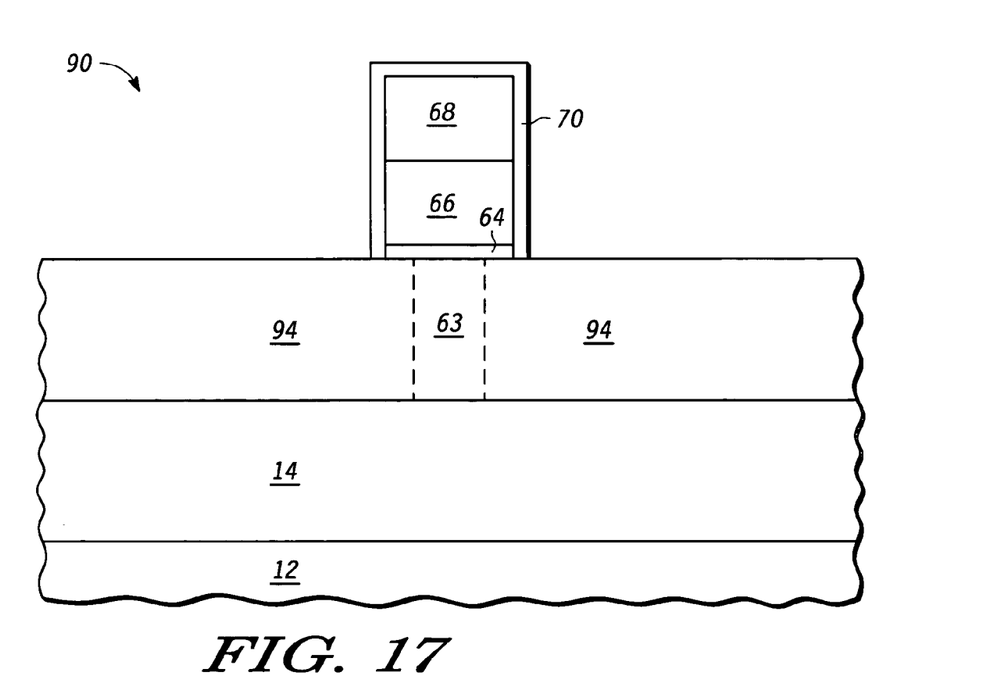

Illustrated in FIG. 17 is a cross-sectional view of semiconductor device 90 wherein SiO2 insulating layer 92 is removed from semiconductor device 90. Insulating layer 92 may be removed by an etch, either wet or dry.

Figure 18:
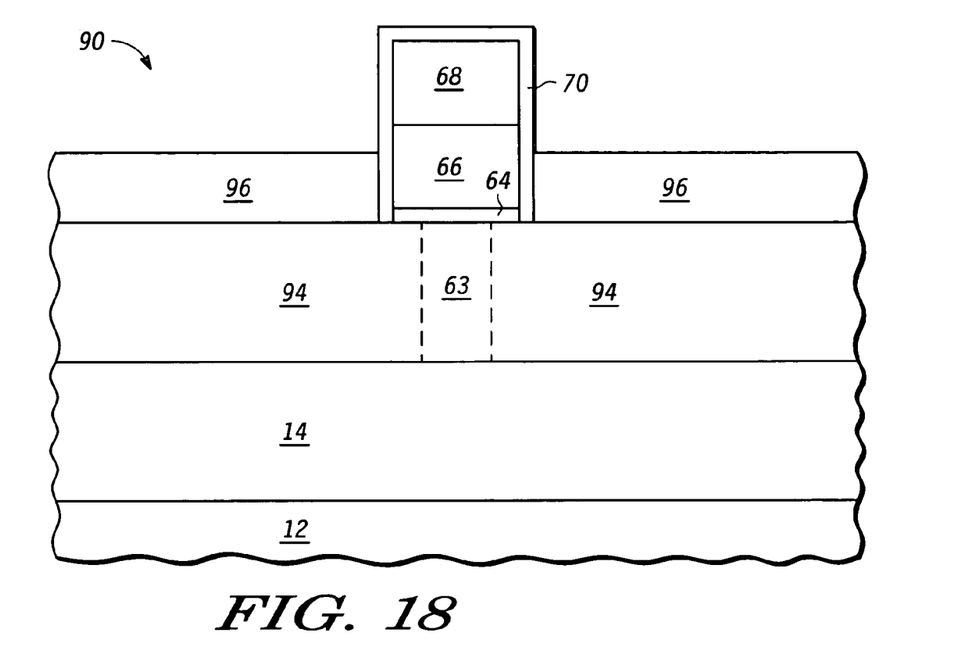

Illustrated in FIG. 18 is a cross-sectional view of semiconductor device 90 wherein a raised source/drain 96 is selectively grown or deposited by overlying and surrounding silicon germanium stressor layer 94. The stressor layer 94 is silicon germanium (SiGe) and may be of other materials such as silicon carbon, carbon and other Group IV elements or alloys.

Figure 19:
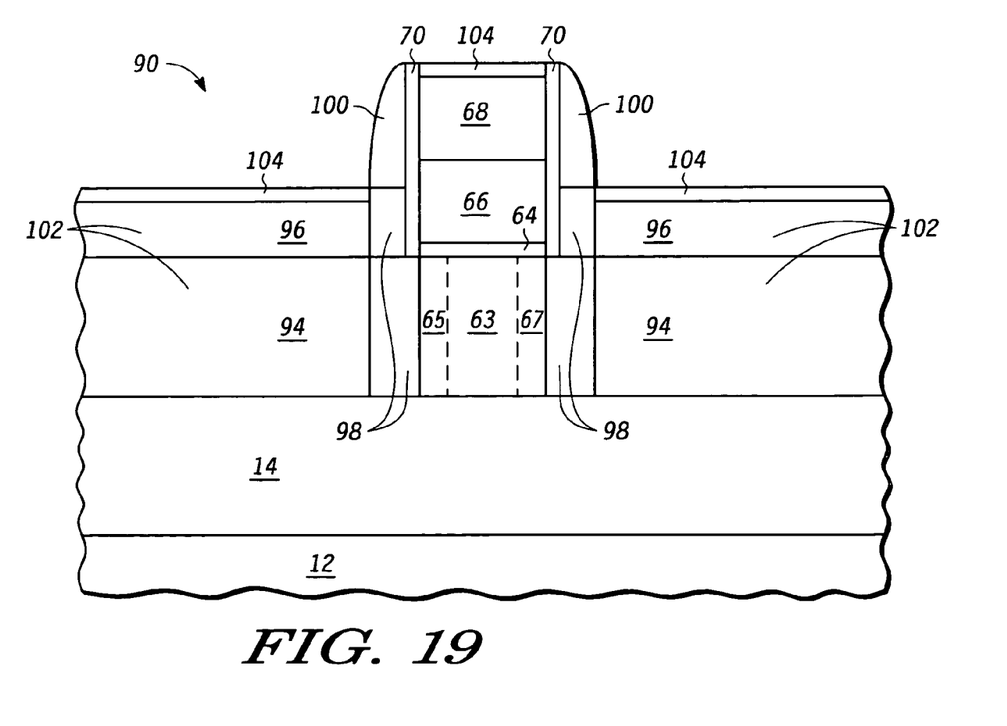

Illustrated in FIG. 19 is a cross-sectional view of semiconductor device 90 wherein source/drain extension implants are formed. The extension implants are performed to create source and drain implants. The extension implants result in formation of dopants at an interface between stressor layer 94 and the raised source/drain 96. The implanted dopants into raised source/drain 96 and stressor layer 94 are annealed to form source and drain extensions 98 in both of these layers. A completed functional transistor is subsequently formed. Sidewall spacers 100 are formed adjacent to dielectric layer 70 in a conventional manner. A thermal anneal process step is performed to cause diffusion of the implanted dopants to form the doped source/drain regions 102. A first portion of stressor layer 94 becomes doped forming the source/drain regions 102. A second portion of stressor layer 94 remains adjacent to the strained channel 63 between the vertical dashed lines defining the strained channel 63 and the edge of the doped source and drain extensions 98. Two heterojunctions as indicated by each of the two vertical dashed lines in FIG. 19 are therefore formed between the strained channel 63 and each of a respective one of the source and drain extensions 98. Silicided regions 104 are formed in a conventional manner overlying the raised source/drain 96 and the gate 68. At this point there has been provided a transistor having a strained channel and heterojunctions in the channel. Also, semiconductor device 90 has a raised source/drain 96 with respective elevated extensions that are the portion of raised doped source and drain extensions 98 underlying the sidewall spacer 100. Because the stressor layer 94 is in very close proximity to the strained channel 63, improved electron and hole mobility and transistor conduction current. While a FINFET embodiment is herein disclosed, it should be well understood that a strained channel transistor may be implemented for any double gate structure using the teachings provided herein.

Figure 20:
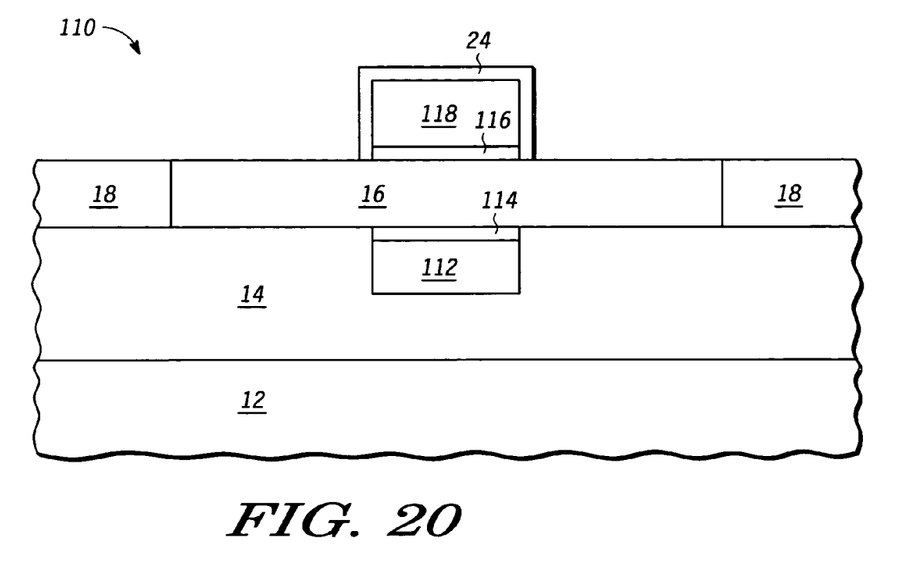
FIGS. 20 and 21 illustrate in cross-sectional form yet an ultra-thin double gate planar transistor in accordance with another form of the present invention.
Figure 21:
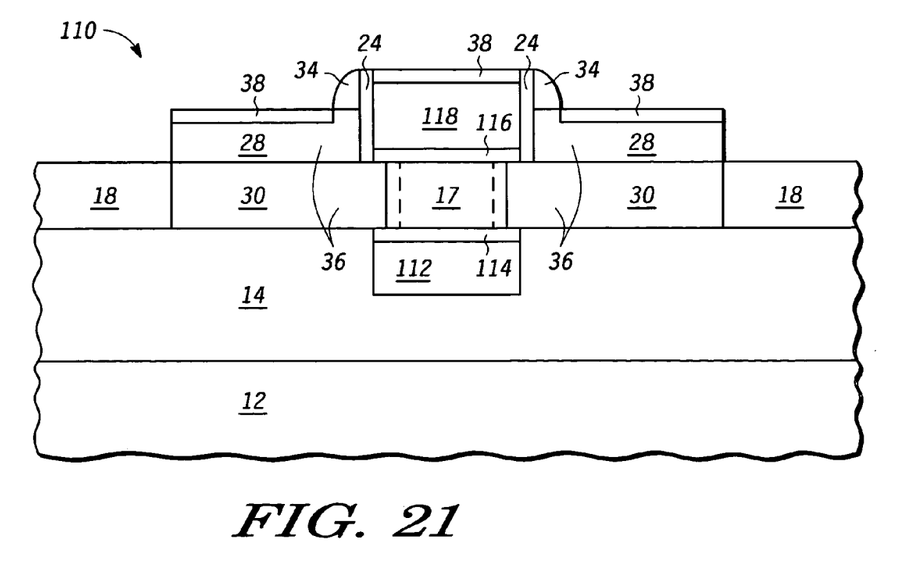

Illustrated in FIGS. 20 and 21 are cross-sectional views of a planar double gate transistor 110. For ease of discussion, elements having reference numbers analogous to the elements illustrated in FIGS. 1–5 and elsewhere are used. Therefore, a complete discussion of the formation of all of the illustrated elements in FIGS. 20 and 21 would be redundant. After dielectric layer 14 is formed overlying substrate 12, a gate 112 is formed within dielectric layer 14 by one of several conventional methods. An overlying gate oxide 114 is formed and has a top surface that is planar with a top surface of the dielectric layer 14. Overlying semiconductor layer 16 is a gate oxide 116. Overlying the gate oxide 116 is a gate 118. All surfaces of the gate oxide 116 and the gate 118 are covered by dielectric layer 24. Transistor 110 of FIG. 20 therefore has a double gate and is a planar gate device.

Illustrated in FIG. 21 is a completed transistor 110 in which the remaining elements of transistor 110 are formed by an analogous method used to form the equivalent elements in the embodiment of FIG. 5. Source/drain regions 36 are formed as discussed above from the formation of stressor material layer 30 and diffusion source 28. Transistor 110 therefore is a double gate device having a heterojunction between its source and channel and a heterojunction between its drain and channel. Transistor 110 is a planar double gate device, as opposed to a FINFET, and has a strained channel of selective characteristics, whether compressive or tensile.

By now it should be appreciated that there have been provided methods for forming a semiconductor device having a strained channel that provides improved transistor performance. A heterojunction, raised source/drain regions and strained channel combine to significantly improve transistor device performance. Methods of formation are herein described in the context of forming both a bulk transistor device and a double gate transistor device. In one form there is provided a method for forming a semiconductor device by providing a semiconductor layer and providing a gate dielectric overlying a first portion of the semiconductor layer. A gate electrode is provided overlying the gate dielectric. The gate electrode and the gate dielectric are encapsulated. A stressor source material is selectively grown overlying a second portion of the semiconductor layer outside the first portion. The stressor material is changed into a diffusion source, wherein changing the stressor material into the diffusion source includes tailoring an amount of diffusion of the stressor material into a channel region of the underlying semiconductor layer. The channel becomes a strained channel.

As the dimensions of thin body transistors continue to grow smaller, a thinner channel region causes threshold voltage of the transistor to increase. By using the materials described herein, such as SiGe, etc., for the semiconductor layer from which the channel is formed, the threshold voltage is lowered and thereby offsets the increase in conventional thin body transistors when scaled to a smaller dimension. Additionally, when mid-gap metals are used as a gate material, a higher transistor threshold voltage. To counteract the rising threshold voltage, the body of the transistor can be doped. However, the doping degrades electrical performance of the transistor and results in increased variability in operating parameters. The use of a source material to provide controlled diffusion into the source/drain and channel regions allows low Vt transistors with mid-gap metal gates and without doping the body.

In one form there is herein provided a semiconductor device having a semiconductor layer and a first gate dielectric adjacent a first side of a first portion of the semiconductor layer. A first gate electrode is adjacent the first gate dielectric. A second gate dielectric is adjacent a second side of the first portion of the semiconductor layer. A second gate electrode is adjacent the second gate dielectric. Material encapsulates at least one of (i) the first gate electrode and the first gate dielectric and (ii) the second gate electrode and the second gate dielectric. A strained channel region has first and second heterojunctions adjacent opposite ends of the strained channel region and within the first portion of the semiconductor layer. A semiconductor material is selectively grown overlying a second portion of the semiconductor layer outside the first portion, wherein the semiconductor material is a material different from a material of the semiconductor layer, and wherein the semiconductor material is used as a diffusion source by controlling an amount of diffusion of the semiconductor material into the strained channel region of the first and second portions of the semiconductor layer. In one form the device further includes source/drain extension regions within the semiconductor layer and at least one sidewall spacer adjacent one or more of the first gate electrode and the second gate electrode. The at least one sidewall spacer is disposed adjacent the source/drain extension regions and the source/drain regions are adjacent the source/drain extension regions and within the semiconductor layer. In another form there are silicided regions of the source/drain regions and at least one of the first gate electrode and the second gate electrode. In one form the first gate electrode and the second gate electrode are a single gate electrode. In another form the semiconductor material includes at least one selected from a source of germanium atoms and carbon doped silicon. In another form the device includes source/drain extension regions within the semiconductor layer and sidewall spacers adjacent the first and second gate electrodes and the source/drain extension regions. Source/drain regions are adjacent the source/drain extension regions within the semiconductor layer. Silicided regions are provided to contact the source/drain regions and the first and second gate electrode. In another form the semiconductor layer includes a semiconductor layer of a semiconductor on insulator substrate. In yet another form the semiconductor on insulator substrate includes a silicon on insulator substrate. In one form an encapsulant is used for minimizing oxygen diffusion into at least one of (i) the first gate electrode and the first gate dielectric and (ii) the second gate electrode and the second gate dielectric. In another form the encapsulatant is one of nitride or oxide, or a combination of nitride and oxide. In another form the semiconductor material includes silicon germanium (SiGe) with a desired Ge concentration. In another embodiment, for a given thickness of the semiconductor material, the desired Ge concentration is inversely proportional to the given thickness, and a function of an oxidation time, in order to preserve a total amount of Ge to be diffused into the first portion and the second portion of the semiconductor layer. In yet another form the desired Ge concentration is greater than 15%. In yet another form the semiconductor material is diffused vertically into the second portion of the semiconductor layer and further diffused laterally within the first portion of the semiconductor layer to a source/channel interface and a drain/channel interface to form heterojunctions at respective interfaces of the strained channel region. In yet another form the semiconductor device is implemented as one of a lateral FET device or a FinFET.

In another form there is herein provided a semiconductor device having a semiconductor layer and a first gate dielectric adjacent a first side of a first portion of the semiconductor layer. A first gate electrode is adjacent the first gate dielectric. A second gate dielectric is adjacent a second side of the first portion of the semiconductor layer. A second gate electrode is adjacent the second gate dielectric. An encapsulating structure or material encapsulates at least one of (i) the first gate electrode and the first gate dielectric and (ii) the second gate electrode and the second gate dielectric. A strained channel region has first and second heterojunctions adjacent opposite ends of the strained channel region and within the first portion of the semiconductor layer. A semiconductor material that is selectively grown overlies a second portion of the semiconductor layer outside the first portion. The semiconductor material is preferably a material different from a material of the semiconductor layer. The semiconductor material is used as a diffusion source by controlling an amount of diffusion of the semiconductor material into the strained channel region of the first and second portions of the semiconductor layer. Source/drain extension regions are within the semiconductor layer and at least one sidewall spacer is adjacent one or more of the first gate electrode and the second gate electrode. The at least one sidewall spacer is further disposed adjacent the source/drain extension regions. Source/drain regions are adjacent the source/drain extension regions and within the second portion of the semiconductor layer. In one form the semiconductor material is diffused vertically into the second portion of the semiconductor layer and further diffused laterally within the first portion of the semiconductor layer to a source/channel interface and a drain/channel interface to form heterojunctions at respective interfaces of the strained channel region. In one form the device is formed to be a lateral device or a vertical device, such as in one example a FinFET.

In the foregoing specification, the invention has been described with reference to specific embodiments. However, one of ordinary skill in the art appreciates that various modifications and changes can be made without departing from the scope of the present invention as set forth in the claims below. For example, silicon carbon or any material that forms an alloy with silicon may be used in lieu of silicon germanium. Various conductivities may be used and differing doping concentrations may be used. Various transistor structures may implement the strained channel methods taught herein including various multiple gate structures, including double gate structures. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A semiconductor device, comprising:
   a semiconductor layer;
   a first gate dielectric adjacent a first side of a first portion of the semiconductor layer;
   a first gate electrode adjacent the first gate dielectric;
   a second gate dielectric adjacent a second side of the first portion of the semiconductor layer;
   a second gate electrode adjacent the second gate dielectric;
   means for encapsulating at least one of (i) the first gate electrode and the first gate dielectric and (ii) the second gate electrode and the second gate dielectric;
   a strained channel region having first and second heterojunctions adjacent opposite ends of the strained channel region and within the first portion of the semiconductor layer; and
   a semiconductor material selectively grown overlying a second portion of the semiconductor layer outside the first portion, wherein the semiconductor material comprises a material different from a material of the semiconductor layer, and wherein the semiconductor material is used as a diffusion source by controlling an amount of diffusion of the semiconductor material into the strained channel region of the first and second portions of the semiconductor layer.

2. The semiconductor device of claim 1, further comprising:
   source/drain extension regions within the semiconductor layer;
   at least one sidewall spacer adjacent one or mate of the first gate electrode and the second gate electrode, the at least one sidewall spacer further being disposed adjacent the source/drain extension regions; and
   source/drain regions adjacent the source/drain extension regions and within the semiconductor layer.

3. The semiconductor device of claim 2, further comprising:
   silicided regions of the source/drain regions and at least one of the first gate electrode and the second gate electrode.

4. The semiconductor device of claim 1, wherein the semiconductor material includes at least one selected from the group consisting of a source of germanium atoms and carbon doped silicon.

5. The semiconductor device of claim 1, further comprising:
   source/drain extension regions within the semiconductor layer;
   sidewall spacers adjacent the first gate electrode, the sidewall spacers adjacent the source/drain extension regions;
   source/drain regions adjacent the source/drain extension regions within the semiconductor layer; and
   silicided regions of the source/drain regions and the first gate electrode.

6. The semiconductor device of claim 1, wherein the semiconductor layer includes a semiconductor layer of a semiconductor on insulator substrate.

7. The semiconductor device of claim 6, wherein the semiconductor on insulator substrate includes a silicon on insulator substrate.

8. The semiconductor device of claim 1, wherein the means for encapsulating includes an encapsulant for minimizing oxygen diffusion into at least one of (i) the first gate electrode and the first gate dielectric and (ii) the second gate electrode and the second gate dielectric.

9. The semiconductor device of claim 1, wherein the means for encapsulating includes an encapsulatant selected from the group consisting of nitride, oxide, and a combination of nitride and oxide.

10. The semiconductor device of claim 1, wherein the semiconductor material includes at least one selected from the group consisting of a source of germanium, carbon doped silicon, boron, phosphorus and arsenic.

11. The semiconductor device of claim 10, further wherein for a given thickness of the semiconductor material, the desired Ge concentration is inversely proportional to the given thickness, and a function of an oxidation time, in order to preserve a total amount of Ge to be diffused into the first portion and the second portion of the semiconductor layer.

12. The semiconductor device of claim 10, further wherein the desired Ge concentration is greater than 15%.

13. The semiconductor device of claim 1, wherein the semiconductor material is diffused vertically into the second portion of the semiconductor layer and further diffused laterally within the first portion of the semiconductor layer to a source/channel interface and a drain/channel interface to form heterojunctions at respective interfaces of the strained channel region.

14. The semiconductor device of claim 1, wherein the semiconductor device includes one selected from the group consisting of a lateral FET device and a FinFET.

15. A semiconductor device, comprising:
   a semiconductor layer;
   a first gate dielectric adjacent a first side of a first portion of the semiconductor layer;
   a first gate electrode adjacent the first gate dielectric;
   a second gate dielectric adjacent a second side of the first portion of the semiconductor layer;
   a second gate electrode adjacent the second gate dielectric;
   means for encapsulating at least one of (i) the first gate electrode and the first gate dielectric and (ii) the second gate electrode and the second gate dielectric;
   a strained channel region having first and second heterojunctions adjacent opposite ends of the strained channel region and within the first portion of the semiconductor layer;
   a semiconductor material selectively grown overlying a second portion of the semiconductor layer outside the first portion, wherein the semiconductor material comprises a material different from a material of the semiconductor layer, and wherein the semiconductor material is used as a diffusion source by controlling an amount of diffusion of the semiconductor material into the strained channel region of the first and second portions of the semiconductor layer;
   source/drain extension regions within the semiconductor layer;
   at least one sidewall spacer adjacent one or more of the first gate electrode and the second gate electrode, the at least one sidewall spacer further being disposed adjacent the source/drain extension regions; and source/drain regions adjacent the source/drain extension regions and within the second portion of the semiconductor layer.

16. The semiconductor device of claim 15, wherein the semiconductor material is diffused vertically into the second portion of the semiconductor layer and further diffused laterally within the first portion of the semiconductor layer to a source/channel interface and a drain/channel interface to form heterojunctions at respective interfaces of the strained channel region.

17. The semiconductor device of claim 15, wherein the semiconductor device includes one selected from the group consisting of a lateral FET device and a FinFET.

* * * * *